(12) United States Patent
Yoshimi et al.

(10) Patent No.: US 9,716,218 B2
(45) Date of Patent: Jul. 25, 2017

(54) METHOD OF MANUFACTURING THERMOELECTRIC MODULE, AND THERMOELECTRIC MODULE

(71) Applicant: AISIN TAKAOKA CO., LTD., Toyota-shi, Aichi (JP)

(72) Inventors: Hitoshi Yoshimi, Toyota (JP); Kiyohito Kondo, Toyota (JP); Huai-sheng Dai, Toyota (JP); Tomiyuki Murayama, Toyota (JP); Zhong-zhi Zhang, Toyota (JP); Takeshi Seo, Toyota (JP)

(73) Assignee: AISIN TAKAOKA CO., LTD., Aichi (JP)

( * ) Notice: Subject to any disclaimer, the term of this patent is extended or adjusted under 35 U.S.C. 154(b) by 0 days.

(21) Appl. No.: 14/443,833

(22) PCT Filed: Nov. 19, 2013

(86) PCT No.: PCT/IB2013/060226
§ 371 (c)(1),
(2) Date: May 19, 2015

(87) PCT Pub. No.: WO2014/080332
PCT Pub. Date: May 30, 2014

(65) Prior Publication Data
US 2015/0303366 A1 Oct. 22, 2015

(30) Foreign Application Priority Data

Nov. 20, 2012 (JP) .................................. 2012-254261

(51) Int. Cl.
*H01L 35/34* (2006.01)
*B22C 9/04* (2006.01)
(Continued)

(52) U.S. Cl.
CPC ................ *H01L 35/34* (2013.01); *B22C 7/02* (2013.01); *B22C 9/04* (2013.01); *B22D 19/16* (2013.01); *H01L 35/32* (2013.01)

(58) Field of Classification Search
None
See application file for complete search history.

(56) References Cited

U.S. PATENT DOCUMENTS 3,248,777 A * 5/1966 Stoll ....................... H01L 35/32
136/201
3,287,473 A * 11/1966 Boyce, Jr. ............... H01L 35/12
136/205
(Continued)

FOREIGN PATENT DOCUMENTS

CN 1601778 A 3/2005
CN 1943918 A 4/2007
(Continued)

OTHER PUBLICATIONS

Koplow, et al., "Thick film thermoelectric energy harvesting systems for biomedical applications," Medical Devices and Biosensors, 2008. ISSS-MDBS 2008. 5th International Summer School and Symposium on. IEEE, 2008.*
(Continued)

*Primary Examiner* — Allison Bourke
*Assistant Examiner* — William E McClain
(74) *Attorney, Agent, or Firm* — Buchanan Ingersoll & Rooney PC

(57) ABSTRACT

A manufacturing method of a thermoelectric module comprises forming a first wax model in which the first thermoelectric elements are arranged in a predetermined pattern, forming a first mold from the first wax model, casting a group of the first thermoelectric elements by pouring molten metal of a first thermoelectric material into the first mold to solidify the molten metal, forming a second wax model that
(Continued)

represents arrangement of second thermoelectric elements to form the thermoelectric module by being connected with the first thermoelectric elements, forming a second mold from the second wax model, casting the group of the second thermoelectric elements by pouring molten metal of a second thermoelectric material into the second mold to solidify the molten metal, and connecting the group of the first thermoelectric elements with the group of the second thermoelectric elements electrically in series.

7 Claims, 7 Drawing Sheets

(51) Int. Cl.
*B22C 7/02* (2006.01)
*B22D 19/16* (2006.01)
*H01L 35/32* (2006.01)

(56) References Cited

U.S. PATENT DOCUMENTS

| | | | | |
|---|---|---|---|---|
| 6,025,554 | A * | 2/2000 | Macris | H01L 35/10 136/200 |
| 6,297,441 | B1 * | 10/2001 | Macris | H01L 35/32 136/201 |
| 6,441,296 | B2 | 8/2002 | Hiraishi et al. | |
| 2004/0256076 | A1 * | 12/2004 | Puffer, Jr. | B22C 7/02 164/412 |
| 2007/0144573 | A1 | 6/2007 | Mihara et al. | |
| 2007/0175506 | A1 | 8/2007 | Horio et al. | |
| 2010/0263701 | A1 | 10/2010 | Yazawa et al. | |
| 2011/0018155 | A1 * | 1/2011 | Stefan | C22C 1/0483 264/13 |

FOREIGN PATENT DOCUMENTS

| | | |
|---|---|---|
| CN | 101194021 A | 6/2008 |
| CN | 100563038 C | 11/2009 |
| EP | 0 795 630 A1 | 9/1997 |
| JP | 8-153901 A | 6/1996 |
| JP | 2002-237622 A | 8/2002 |
| JP | 2002-359405 A | 12/2002 |
| JP | 2005-217055 A | 8/2005 |
| JP | 2005-340529 A | 12/2005 |
| JP | 2010-135455 A | 6/2010 |
| JP | 2012-028388 A | 2/2012 |
| KR | 20100024028 A | 3/2010 |

OTHER PUBLICATIONS

Machine Translation of KR 1020100024028.*
Chinese Official Action issued Sep. 5, 2016, by the China Patent Office, in corresponding Chinese Patent Application No. 201380060466.4 with English translation (12 pages).
International Search Report (PCT/ISA/210) mailed on Mar. 6, 2014, by the Japanese Patent Office as the International Searching Authority for International Application No. PCT/IB2013/060226.
Written Opinion (PCT/ISA/237) mailed on Mar. 6, 2014, by the Japanese Patent Office as the International Searching Authority for International Application No. PCT/IB2013/060226.
International Preliminary Report on Patentability (PCT/IPEA/409) mailed on Apr. 10, 2015, by the Japanese Patent Office as the International Preliminary Examining Authority for International Application No. PCT/IB2013/060226.
Written Opinion (PCT/IPEA/408) mailed on Oct. 30, 2014, by the Japanese Patent Office as the International Preliminary Examining Authority for International Application No. PCT/IB2013/060226.
Office Action dated May 30, 2014, by the Japanese Patent Office for Application No. 2012-254261.
Second Office Action issued Apr. 21, 2017, by the State Intellectual Property Office of People's Republic of China, in corresponding Chinese Patent Application No. 201380060466.4, with English translation thereof (23 pages).

* cited by examiner

METHOD OF MANUFACTURING THERMOELECTRIC MODULE, AND THERMOELECTRIC MODULE

CROSS-REFERENCE TO RELATED APPLICATIONS

The present application claims priority based on JP Patent Application 2012-254261 filed in Japan on Nov. 20, 2012, whose entire disclosure is incorporated herein by reference thereto. The present invention relates to a method of manufacturing a thermoelectric module, to which a casting method is applied, and a thermoelectric module manufactured by the method.

BACKGROUND

A thermoelectric conversion technology which can directly convert thermal energy into electric energy has attracted attention as one of technologies that recover and utilize waste heat which has not been used. As a means of realizing the thermoelectric conversion, a thermoelectric module has been known, which makes use of the Seebeck effect. The thermoelectric module is an assembly having pairs of thermoelectric materials made up of two types of metals or semiconductors, one type alternating with the other one. A major structure of the thermoelectric module is generally referred to as a pi type structure, in which the thermoelectric materials made up of a p-type semiconductor and n-type semiconductor are alternatingly arranged in two dimensions, and these thermoelectric materials are electrically connected in series and thermally connected in parallel via electrodes. In the thermoelectric module having the pi type structure, when there is a difference in temperature between an upper side and a lower side, carriers that carry an electric charge are diffused along thermal flux that flows from a higher temperature side to a lower temperature side, and an electric current flows in one direction if a closed circuit is made by, for example, connecting a load because the materials whose carriers have different polarities are alternatingly disposed, thereby generating the electric power.

As a manufacturing method for the thermoelectric module having the pi type structure, a method has been known, in which ingots of the thermoelectric materials are formed by a hot-press method or the like, thermoelectric conversion elements cut out from the ingots are disposed on a substrate, and electrodes are formed by soldering, metallization or the like. PTL 1 (JP2005-217055A) discloses a technique of adhering solder paste to a thermoelectric element by printing the solder paste on a circuit conductor of a substrate, arranging a plurality of n-type thermoelectric elements and p-type thermoelectric elements on a supporting member and transcribing the elements on the solder paste followed by heating.

PTL 2 (JP2010-135455A) discloses a technique that manufactures a thermoelectric conversion module by using an alloy as a raw material, the alloy comprising at least one element selected from a group of Bi and Sb and at least one element selected from a group of Te and Se. In the method manufacturing of the thermoelectric conversion module, disclosed in PTL 2, the material is once melted and formed into an ingot, the ingot is heated and melted again, and the material is cooled by a liquid quenching method and formed into powder. The resulting powder is set into a mold, heated and extruded under an atmosphere of Argon gas, and thus formed into a thermoelectric material having a necessary strength. The resulting thermoelectric material is worked to a thermoelectric module.

PATENT LITERATURE

PTL

[PTL 1]
JP2005-217055A (Paragraphs 0033-0047)
[PTL 2]
JP2010-135455A (Example 1, FIG. 1)

SUMMARY

The disclosures of the above Patent Literatures are incorporated herein by reference thereto.

The following analysis is given in view of the present invention. In conventional manufacturing methods for a thermoelectric material, the thermoelectric material having high strength is manufactured by melting a raw material for the thermoelectric material including Bi, Te and the like to form an ingot, heating the ingot again to melt, cooling the molten material to form powder by a single roll method, a double roll method, a gas-atomizing method, a rotating disk method or the like, and extruding the powder. However, such manufacturing method needs the melting process twice and results in a problem of large energy consumption. Besides the conventional manufacturing methods for the thermoelectric module need the processing such as slicing or dicing to cut out the extruded thermoelectric material and results in a problem of yield lowering because of a large margin at processing. Further, there is a problem of increasing manufacturing costs for low productivity because, in a process of arraying thermoelectric elements, it is necessary to accurately set positions of a large number of the thermoelectric elements and array them on a substrate.

The present invention is made, setting as a problem to be solved, to provide a method of manufacturing a thermoelectric module which does not need a process of cutting out thermoelectric elements having a necessary shape from a thermoelectric material, a process of arraying the thermoelectric elements on a substrate, and a process of shaping an electrode between the thermoelectric elements. It is an object for the present invention to provide a technique of manufacturing the thermoelectric module having a high degree of freedom in its shape by providing a new manufacturing method of the thermoelectric module that comprises a less number of processes.

A first aspect relates to a method of manufacturing a thermoelectric module. The method of manufacturing a thermoelectric module comprises: forming a first wax model which represents a state where first thermoelectric elements being a p-type thermoelectric element or n-type thermoelectric element are arranged in a predetermined pattern; forming a first mold by setting a mold material in which the first wax model has been imbedded, and melting out the first wax model; and casting a group of the first thermoelectric elements that are arranged in a predetermined pattern, by pouring molten metal of a first thermoelectric material into the first mold to solidify the molten metal (a first casting). In addition, the method of manufacturing a thermoelectric module according to the present invention comprises: forming a second wax model which represents a state where second thermoelectric elements are arranged in a predetermined pattern that is allowed to be connected with the first thermoelectric elements, the second thermoelectric elements being an n-type thermoelectric element or p-type thermoelectric element that is connected with the first thermoelectric element to form the thermoelectric module; forming a second mold by setting a mold material in which the second wax model has been imbedded, and melting out the second wax model; casting a group of second thermoelectric elements that are arranged in a predetermined pattern, by pouring molten metal of a second thermoelectric material into the second mold to solidify the molten metal (a second casting); and jointing the group of the first thermoelectric elements with the group of the second thermoelectric elements electrically in series (a combining).

The p-type thermoelectric element mentioned herein is a thermoelectric element using a material that uses a lack of an electron as a "carrier" that carries an electric charge, referred to as a hole. The n-type thermoelectric element is a thermoelectric element using a material that uses a free electron as a "carrier" that carries an electric charge.

In the preferred method of manufacturing a thermoelectric module, it is preferred that the wax model is integrally provided with a gate/runner model that is a flowing path for the molten metal of the thermoelectric material; that a wax model assembly is formed, in which a plurality of the wax models are connected in a tree shape via the gate/runner model; and that a plurality of the groups of the thermoelectric elements are simultaneously cast in one casting, using a mold that is formed from the wax model assembly.

In the preferred method of manufacturing a thermoelectric module, the thermoelectric elements represented by the wax model may be formed so that their bases lie along a predetermined curved surface; and the cast group of the thermoelectric elements may be allowed to be arranged on the predetermined curved surface. Preferably, the second mold is combined with the group of the first thermoelectric elements when the second mold is formed; and the thermoelectric module, in which the group of the first thermoelectric elements and the group of the second thermoelectric elements are jointed with each other, is cast by pouring molten metal of the second thermoelectric material into the second mold to solidify the molten metal. The second casting and jointing may be simultaneously performed using the second mold that is combined with the group of the first thermoelectric elements.

A second aspect provides another method of manufacturing a thermoelectric module. The method of manufacturing a thermoelectric module comprises: forming a first wax model which represents a state where first thermoelectric elements to be a p-type thermoelectric element or n-type thermoelectric element are arranged in a predetermined pattern; forming a first mold by setting a mold material in which the first wax model has been imbedded, and melting out the first wax model; and casting a group of first thermoelectric elements that are arranged in a predetermined pattern, by pouring molten metal of a first thermoelectric material into the first mold to solidify the molten metal. The method of manufacturing a thermoelectric module according to the present invention further comprises: forming a second wax model which represents a state where second thermoelectric elements are arranged in a predetermined pattern that is allowed to be jointed with the first thermoelectric elements electrically in series, the second thermoelectric elements being an n-type thermoelectric element or p-type thermoelectric element that is connected with the first thermoelectric element to form the thermoelectric module; combining the group of the first thermoelectric elements with the second wax model; forming a second mold, which is combined with the group of the first thermoelectric elements, by setting a mold material in which the combination of the group of the first thermoelectric elements and the second wax model has been imbedded, and melting out the second wax model; and casting a thermoelectric module in which the group of the first thermoelectric elements is jointed with the group of the second thermoelectric elements, by pouring molten metal of a second thermoelectric material into the second mold to solidify the molten metal.

A third aspect provides a new thermoelectric module. In the thermoelectric module of the present invention, a group of p-type thermoelectric elements that are cast in a predetermined two-dimensional arrangement is directly and electrically connected in series with a group of n-type thermoelectric elements that are cast in a predetermined two-dimensional arrangement that is allowed to be jointed with the group of the p-type thermoelectric elements. In the preferred thermoelectric module, each of the p-type thermoelectric elements is formed of a p-type main body and p-type connecting parts (the p-type connecting parts are disposed on both sides of the p-type main body and project toward the adjacent n-type thermoelectric elements), each of the n-type thermoelectric elements is formed of an n-type main body and n-type connecting parts (the n-type connecting parts are disposed on both sides of the p-type main body and project toward the adjacent p-type thermoelectric elements), and the p-type connecting parts directly contact the n-type connecting parts.

In the preferred thermoelectric module, each of the p-type thermoelectric elements is formed of a p-type main body and a p-type connecting part (the p-type connecting part is disposed on one side of the p-type main body and projects toward the adjacent n-type thermoelectric element), each of the n-type thermoelectric elements is formed of an n-type main body and an n-type connecting part (the n-type connecting part is disposed on one side of the n-type main body and projects toward the adjacent p-type thermoelectric element), and the p-type connecting parts directly contact the n-type main bodies, and the n-type connecting parts directly contact the p-type main bodies.

In the preferred thermoelectric module, both the group of p-type thermoelectric elements and the group of n-type thermoelectric elements are cast by a lost wax method, respectively.

According to these aspects, it is possible to integrate conventional processes of powdering a raw material, cutting a thermoelectric material, arraying a thermoelectric element and connecting the thermoelectric elements by manufacturing a thermoelectric module by a casting method and, as a result, to simplify an equipment and to decrease manufacturing costs. It is also possible to improve a degree of freedom in a design of shape of the thermoelectric module because a wax model used in precision casting can serve to represent the thermoelectric element having a desired shape.

PREFERRED MODES

Figure 1:
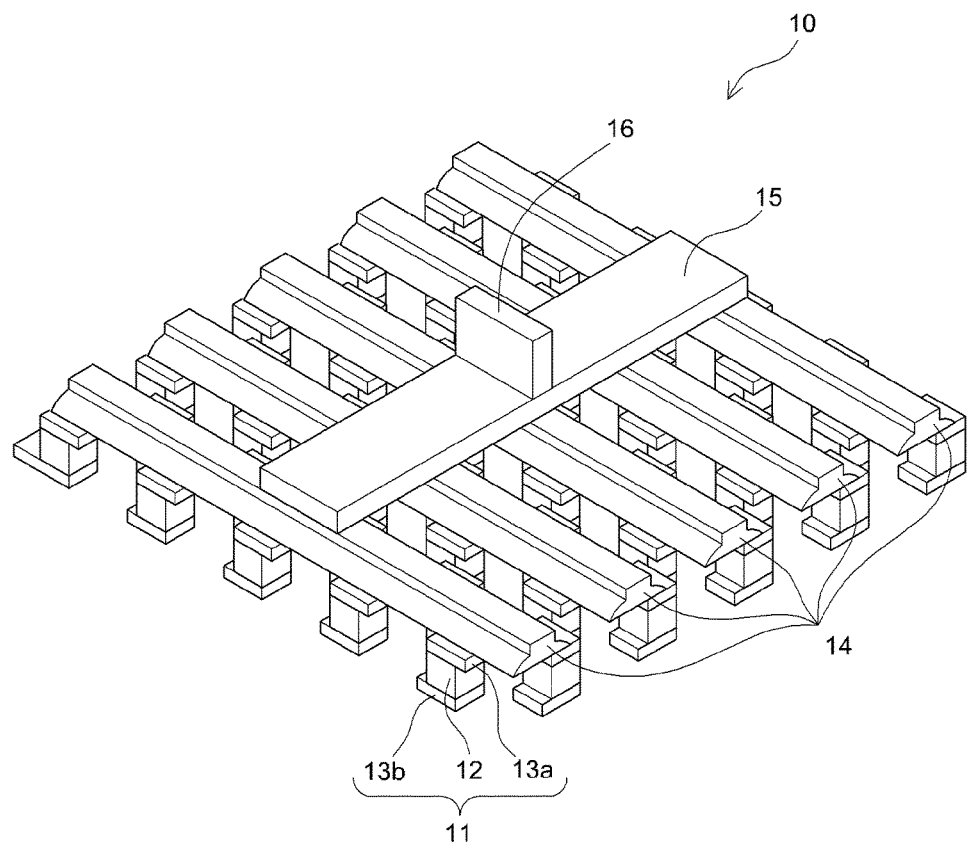
FIG. 1 is a perspective view of a first wax model 10 that represents a group of first thermoelectric elements according one exemplary embodiment.

Referring to the drawings, a method of manufacturing a thermoelectric module according to one exemplary embodiment of the present disclosure and the thermoelectric module manufactured by the method will be explained below. In addition, other exemplary embodiments and preferred modes of the present disclosure will be also mentioned.

Figure 9:
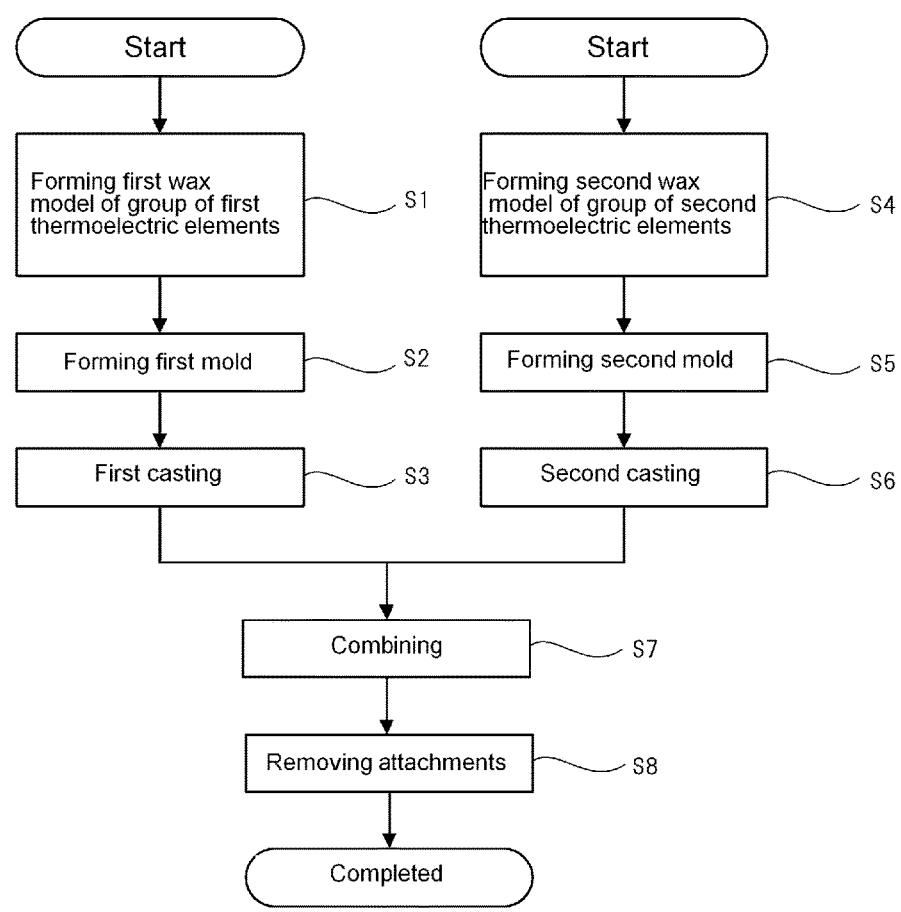
FIG. 9 is a flow chart illustrating a process of manufacturing a thermoelectric module according to one exemplary embodiment.

FIG. 9 shows a flow chart illustrating a process of manufacturing the thermoelectric module according to the present exemplary embodiment. In the present exemplary embodiment, the thermoelectric module is manufactured by applying a lost wax method in a precision casting method. The method of manufacturing the thermoelectric module according to the present exemplary embodiment comprises forming a wax model, forming a mold, and casting. In the forming that forms the wax model, the model having a body of a thermoelectric element and attachments, such as a runner, gate and the like, in one body is formed with wax. In the forming of the mold, the formed wax model is fixed in a heat-resistant metal container, and a filler material (optionally including binder), which is to become the mold, in a slurry state is poured into the container and set. Subsequently, "dewaxing" is performed, in which the wax is melted and removed by heating the set mold material, and the mold is shaped by be further fired at a high temperature. In the casting, molten metal is poured into the resultant mold and cooled. Finally, a cast product is obtained by breaking the mold. The present exemplary embodiment comprises casting a group of first thermoelectric elements and a group of second thermoelectric elements by this precision casting method and combining them.

Figure 4:
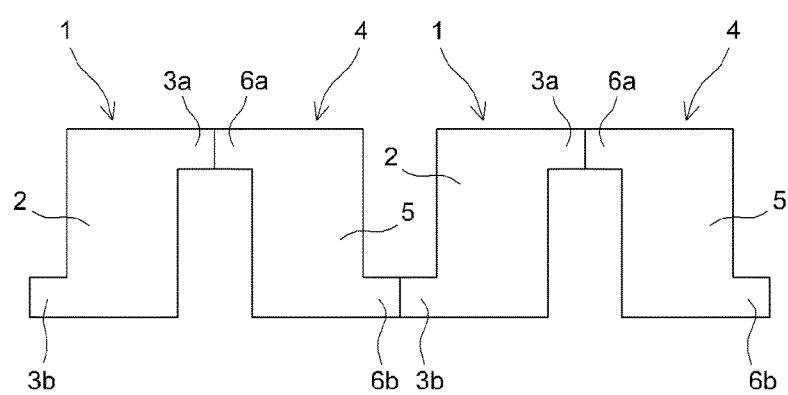
FIG. 4 is a plan view illustrating a state where first thermoelectric elements 1 are combined with second thermoelectric elements 4.

Each process in the method of manufacturing the thermoelectric module will be explained in detail below. In a forming of a first wax model (S1), a first wax model 10 is formed, which reproduces a state where a plurality of the first thermoelectric elements are arranged in a two-dimensional pattern having a certain number of rows and columns. FIG. 4 shows the first thermoelectric elements 1 reproduced in the present exemplary embodiment. In the first thermoelectric element 1, a connecting part 3a for being connected with an upper part of a second thermoelectric element 4 projects at an upper part of a main body 2 having a shape of a quadrangular prism, and a planer connecting surface is provided in a tip of the connecting part 3a. A connecting part 3b for being connected with a lower part of the second thermoelectric element 4 projects at a lower part of the main body 2, and a planer connecting surface is provided in a tip of the connecting part 3b. The directions of the projections of the connecting part 3a and connecting part 3b are different from each other by 90 degrees or 180 degrees so as to connect the connecting part 3a and connecting part 3b with different second thermoelectric elements, respectively.

FIG. 1 shows a perspective view of the first wax model 10 formed in the forming of the first wax model (S1). In the thermoelectric module manufactured in the present exemplary embodiment, the first thermoelectric elements and second thermoelectric elements are alternatingly arranged in a two-dimensional pattern having rows and columns. Therefore, in models 11 of the first thermoelectric elements, the first thermoelectric elements are arranged in the two-dimensional pattern having rows and columns in a state where spaces (intervals) for one second thermoelectric element are provided in front, back, left and right of the first thermoelectric element. The main body 2 of the first thermoelectric element is reproduced as a main body model 12. The connecting parts 3a, 3b are reproduced as connecting part models 13a, 13b. In an upper part of the first wax model 10, a plurality of runner models 14 for introducing molten metal of the thermoelectric material are disposed as an attachment, and upper parts of all models 11 of the first thermoelectric elements are connected with undersides of the runner models 14 in one body. All runner models 14 are further connected with a runner model 16 through a runner model 15. An upper part of the runner model 16 is formed so as to be connected with a gate model, which is not shown.

In the forming of the first wax model, the shapes of the group of the first thermoelectric elements and attachments are truly reproduced by applying an injection molding method or rapid prototyping method. Alternatively, the shape of the first thermoelectric element 1 may be reproduced with the wax by using a 3D printer.

Next, in the method of manufacturing the thermoelectric module according to the present exemplary embodiment, a forming of a first mold (S2) is performed. In the forming, the first wax model 10 is fixed in a heat-resistant metal container, and a filler material, which is a mold material, in a slurry state is poured into the container. It is preferred that the filler material for the molding material is poured until a state where environs of a position corresponding to the gate model of the first wax model 10 are filled with the filler material. As the filler material, gypsum or a silica type of the filler material may be used, for example, in consideration of a temperature of molten metal to be cast. It may be possible to perform the forming by putting (embedding) the wax model into the container in which the filler material is charged in advance. After pouring the filler material, ultrasonic waves or vibration is given to remove air bubbles adhered to the mold, drying is performed, and the mold is formed by setting (curing or hardening) the filler material. The air bubbles may be removed by applying vacuum or reducing pressure. Next, the set filler material is heated at a temperature higher than a melting temperature of the wax in a state where the whole metal container is rotated so as to face the gate 16 to the underside, and the wax is melted and discharged. The mold is completed by being fired at a high temperature. After discharging the wax, a cavity corresponding to the shapes of the group of the first thermoelectric elements, the runner models 14, 15, 16 and the gate model is formed inside of the mold.

Using the completed mold, a first casting (S3) is performed. In the first casting, the first thermoelectric material is melted in the air atmosphere, in a vacuum or in an atmosphere of an inert gas to be converted into molten metal, and the molten metal is poured from the formed gate and allowed to solidify to obtain a cast product. In the process, if fluidity of the molten metal is poor, a pressure casting method or vacuum casting method may be applied to improve the fluidity, thereby coping with the molten metals having various properties. When the wax model 10 is formed, the shape, position and/or number of the runner(s) may be suitably modified to improve the fluidity, thereby coping with the thermoelectric materials having different properties.

In the casting, after the first thermoelectric material reaches the solidifying temperature, the metal container is immediately put into water to quench the whole body, and therefore the completed cast product can be taken easily from the filler material. If the quenching is not performed, the whole cast product may be taken out after being cooled sufficiently, and the filler material can be removed from the cast product by shot blasting, grinding or the like. The completed cast product is formed of the first thermoelectric material and has the shape that unites the arranged first thermoelectric elements 1 and the attachments 9 made of the thermoelectric material that is solidified in the runners and gate.

A forming of a second wax model (S4) may be performed independently from the forming of the first wax model. In the forming of the second wax model, a second wax model 20 is formed. The second wax model 20 gives a reproduction of a group of the second thermoelectric elements that are arranged in a predetermined two-dimensional pattern so as to be electrically connected in series with the first thermoelectric elements. In the second thermoelectric element 4 (see FIG. 4) reproduced in the present exemplary embodiment, a connecting part 6a for being connected with the upper part of the first thermoelectric element 1 projects at an upper part of a main body 5 having a shape of a quadrangular prism, and a planer connecting surface is provided in a tip of the connecting part 6a. A connecting part 6b for being connected with the lower part of the first thermoelectric element 1 projects at a lower part of the main body 5, and a planer connecting surface is provided in a tip of the connecting part 6b.

Figure 2:
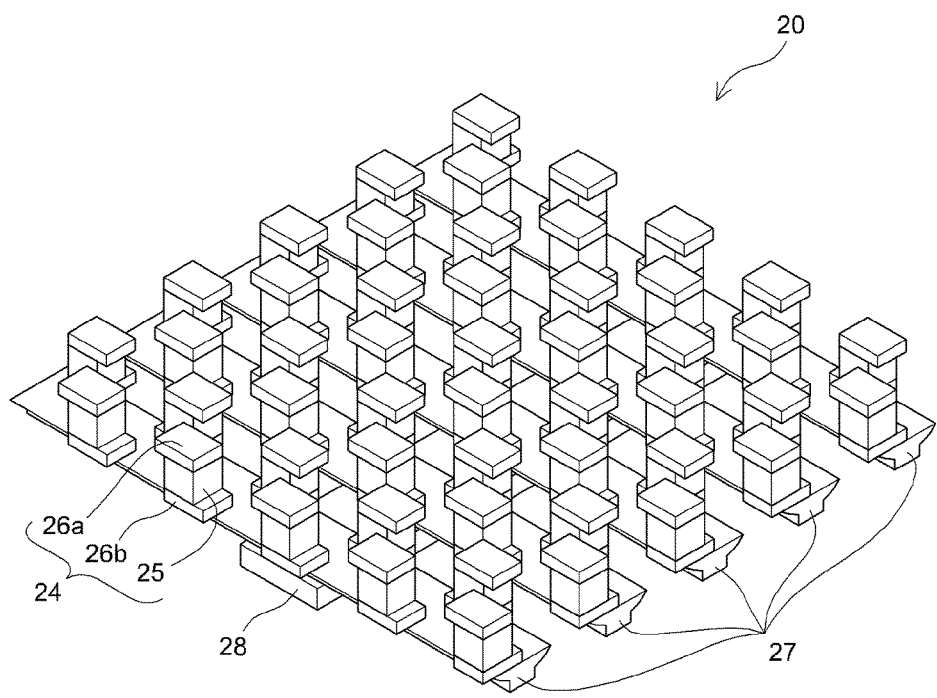
FIG. 2 is a perspective view of a second wax model 20 that represents a group of second thermoelectric elements according one exemplary embodiment.

FIG. 2 shows a perspective view of the second wax model 20 that reproduces a group of the second thermoelectric elements. Models 24 of the second thermoelectric elements are arranged in a pattern that is complementary to the positions of the first thermoelectric elements 1. The main body 5 of the second thermoelectric element 4 is reproduced as a main body model 25. The connecting parts 6a, 6b are reproduced as connecting part models 26a, 26b. In addition, in a lower part of the second wax model 20, a plurality of runner models 27 to introduce the molten metal for the second thermoelectric material are disposed, bottoms of all models 24 of the second thermoelectric elements are connected to upper surfaces of the runner models 27 to form a unified body. All runner models 27 are further connected to a runner model 28 having a gate model that is not illustrated. In the forming of the second wax model, shapes of the second thermoelectric elements 4 are truly reproduced with the wax by applying an injection molding method or rapid prototyping method or by using a 3D printer, in the same way as the forming of the first wax model.

A forming of a second mold (S5) may be performed in the same mode as the forming of the first mold (S2). A second casting (S6) may be performed in the same mode as the first casting (S3). A cast product completed by the casting (S6) is made of the second thermoelectric material and has the shape that unites the arranged second thermoelectric elements 4 with the attachments 9.

Figure 3:
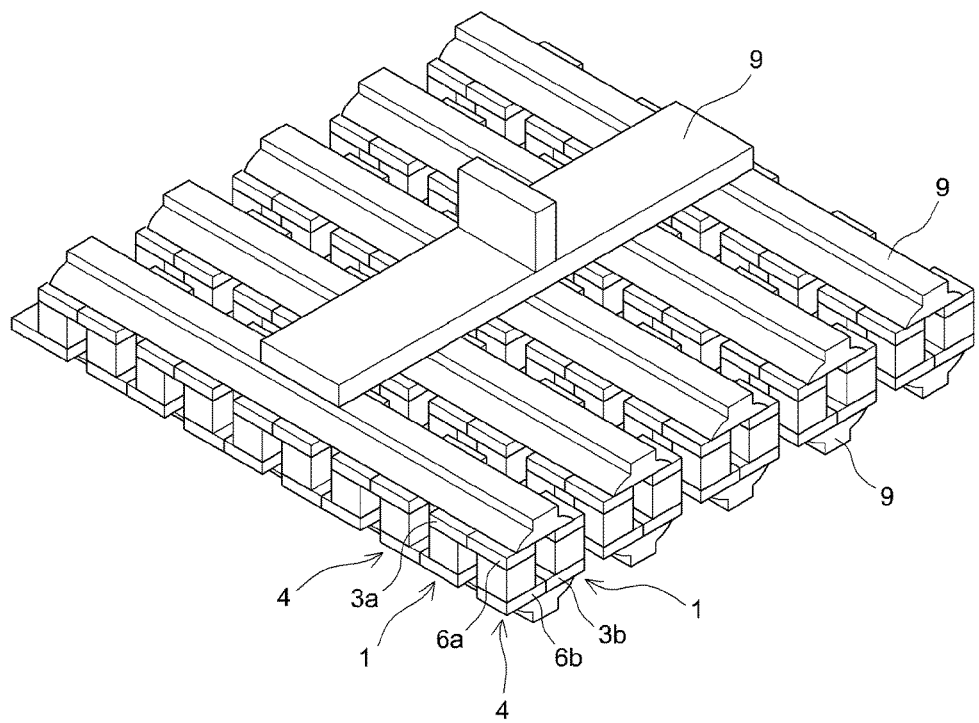
FIG. 3 is a perspective view illustrating a state where a cast group of the first thermoelectric elements is combined with a cast group of the second thermoelectric elements.

In a combining (S7), as shown in FIG. 3, the position of the connecting surface at the tip of the connecting part 3a of the first thermoelectric element 1 is set so as to match with that of the connecting surface at the tip of the connecting part 6a of the second thermoelectric element 4, the position of the connecting surface at the tip of the connecting part 3b of the first thermoelectric element 1 is simultaneously set so as to match with that of the connecting surface at the tip of the connecting part 6b of the second thermoelectric element 4, and these are combined. As the combining manner, diffusion junction, cold welding, fused junction or the like may be suitably used. When the connection is completed, all the first thermoelectric elements 1 and second thermoelectric elements 4 are alternatingly and electrically connected in series with each other.

In a removing of the attachments (S8), the attachments 9 other than the first thermoelectric elements 1 and second thermoelectric elements 4 are cut or ground to be removed. By removing the attachments 9, the thermoelectric module is completed, in which the first thermoelectric elements and second thermoelectric elements are alternatingly arranged in series.

As explained above, the method of manufacturing the thermoelectric module according to the present exemplary embodiment can obtain each thermoelectric element by once melting and casting each thermoelectric material, and can reduce the energy consumption in manufacturing as compared with the conventional one. Since the cutting processing of the thermoelectric material that is necessary for the conventional method of manufacturing the thermoelectric module is unnecessary, offering an effect that the yield relative to the raw material is high. Since the thermoelectric elements are cast in one body and in the state where these are arranged in the predetermined pattern, it is unnecessary to position the thermoelectric elements on the substrate with accurate positioning, thereby providing a higher mass-productivity.

<Preferred Method of Manufacturing Thermoelectric Module>

A preferred method will be explained below, in which a plurality of groups of thermoelectric elements are formed in one casting, and the efficiency of manufacturing a thermoelectric module can be improved. The present exemplary embodiment has a characteristic that a plurality of the groups of the thermoelectric elements are formed using a united wax model assembly in which a plurality of wax models are connected in a tree shape. A detailed explanation on the same processes as those of the above exemplary embodiment will be omitted.

Figure 7:
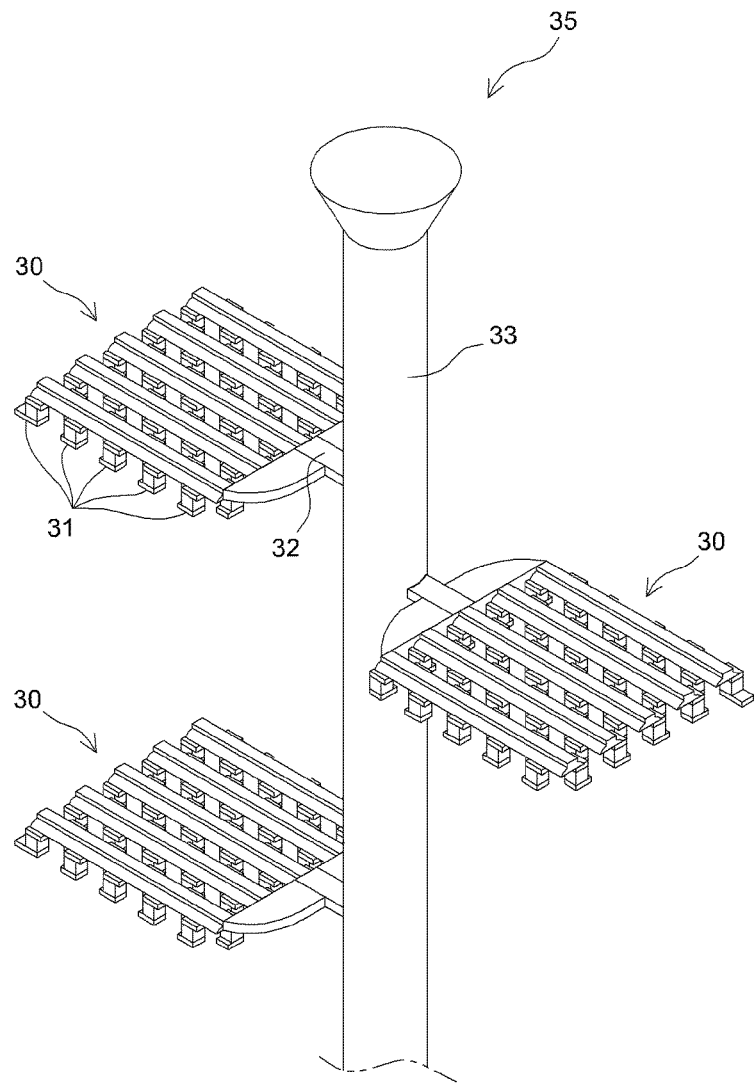
FIG. 7 is a perspective view of a wax model assembly 35 in which a plurality of wax models 30 are connected in a tree-shape.
Figure 10:
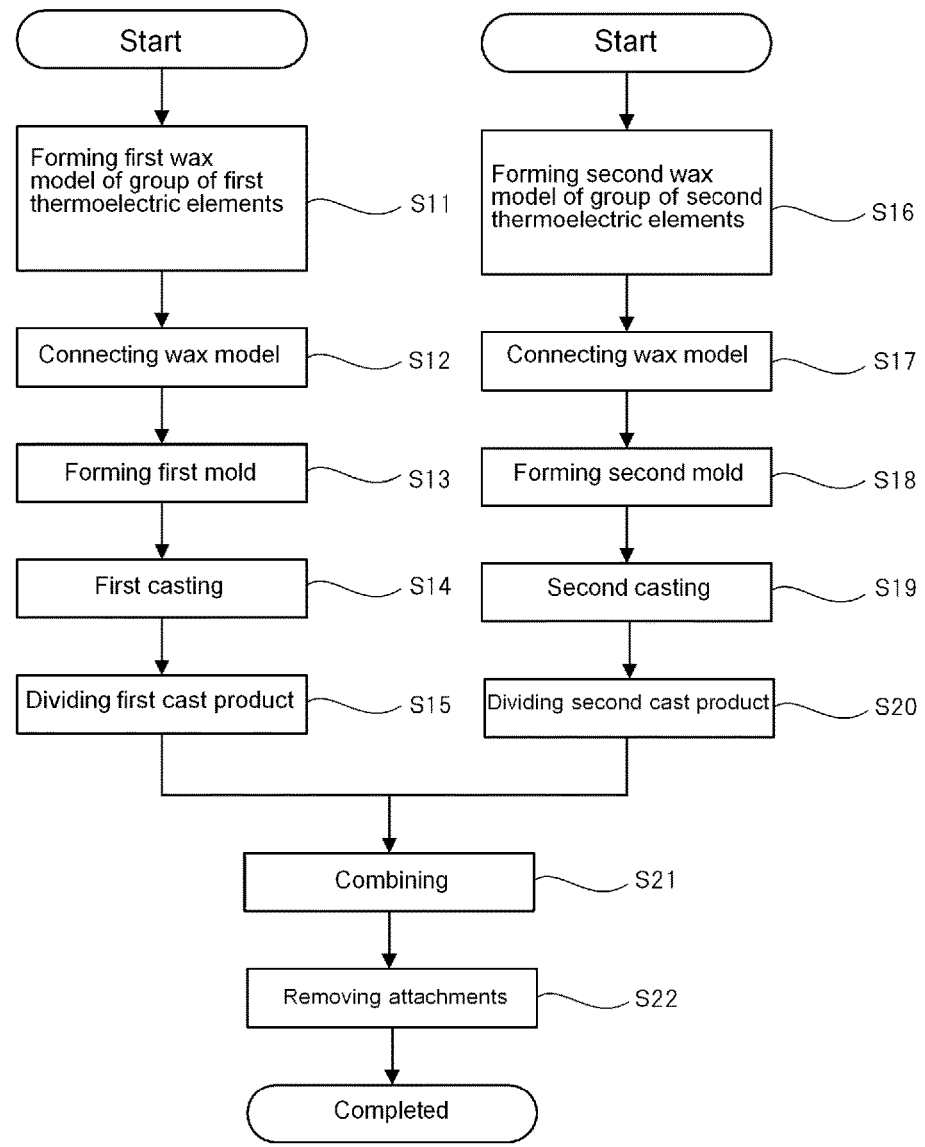
FIG. 10 is a flow chart illustrating a process of manufacturing a thermoelectric module according to another exemplary embodiment.

FIG. 10 shows a flow chart of a method of manufacturing a thermoelectric module, which is indicated in the present exemplary embodiment. A process of manufacturing first thermoelectric elements and a process of manufacturing second thermoelectric elements are separately performed from a forming of a wax model to a dividing of a cast product. In the forming of the wax model (S11, S16), first wax models and second wax models are formed, respectively. The models formed in these processes are of a part that unites a group of main body models 31 that are arranged in a predetermined pattern and a runner model 32 extending in a horizontal direction, and correspond to parts indicated by sign 30 in FIG. 7. In the present exemplary embodiment, next, processes of connecting the formed wax models (S12, S17) are performed. In the connecting of the wax models (S12, S17), a plurality of the wax models 30 are united in a tree shape by connecting the runner models 32 in the wax models 30 to a gate/runner model 33 which has a prop shape and is disposed in a center. The runner models 32 are connected with the gate/runner model 33 by heating connection parts of both wax models at a temperature of about 100 degrees Celsius, for example, at which the wax is softened. By the connecting of the first wax models (S12), a first wax model assembly 35 is formed, in which a plurality of the first wax models 30 are connected (integrated) in a tree shape. By the connecting of the second wax models, a second wax model assembly is formed, in which a plurality of the second wax models are connected in a tree shape.

In forming of a mold (S13, S18), each resultant wax model assembly 35 is fixed in a metal container, and a filler material is poured into the container to form the mold. Casting processes (S14, S19) are performed pouring molten metal for the thermoelectric material into the resultant mold, and it is possible to cast a plurality of the groups of the thermoelectric elements simultaneously in one casting. Completed cast product is divided into the groups of the thermoelectric elements (S15, S20). The thermoelectric module may be made by performing a combining of the group of the first thermoelectric elements with the group of the second thermoelectric elements (S21) and a removing of attachments (S22). According to the method of manufacturing the thermoelectric module according to the present exemplary embodiment, since a plurality of the groups of the thermoelectric elements can be obtained at once, a manufacturing efficiency (i.e., yield) is further improved, and the thermoelectric module can be manufactured at less costs.

<Method of Manufacturing Thermoelectric Module According to Another Exemplary Embodiment>

Figure 11:
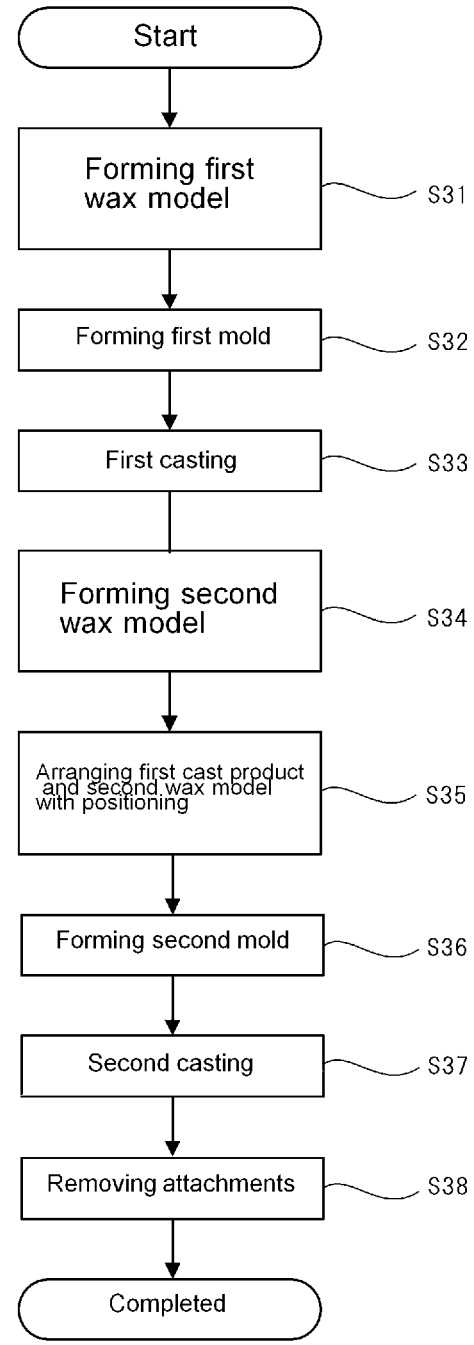
FIG. 11 is a flow chart illustrating a process of manufacturing a thermoelectric module according to still another exemplary embodiment.

FIG. 11 shows a flow chart for a process of manufacturing a thermoelectric module according to another exemplary embodiment, and each process will be explained below. In the present exemplary embodiment, at first, a forming of a first wax model (S31), a forming of a first mold (S32) and a first casting (S33) are performed successively, thereby forming a first cast product in which a group of first thermoelectric elements and attachments are united. Next, a wax model of a group of second thermoelectric elements is formed (S34). The wax model of the group of the second thermoelectric elements represents arrangement and shape of the group of the second thermoelectric elements that are arranged in a predetermined pattern so as to be electrically connected to the first thermoelectric elements in series. Next, the thermoelectric elements of the first cast product and the thermoelectric element model of the second wax model are arranged in a state where the positions of their connecting surfaces are matched each other (S35). In a state where the first cast product and second wax model are fixed with positioning (i.e., matched positions), this connection is performed by heating the wax at the connecting surface of the thermoelectric element model of the second wax model. Conversely, the connection may be achieved by heating the connecting surface of the thermoelectric element in the first cast product. Next, an intermediate assembly in which the connecting surface of the first cast product is in contact with the connecting surface of the second wax model is imbedded in a filler material that is a mold material, and the mold is set (hardened or cured) and thereafter heated to melt to remove (i.e., melt out) the second wax model. Therefore, the second mold corresponding to a group of the second thermoelectric elements is formed at a predetermined position to which the group of the first thermoelectric elements is electrically connected in series (S36). Molten metal of the second thermoelectric material is poured into (cavity of) the second mold to be solidified, thereby manufacturing the thermoelectric module in which the molten metal of the second thermoelectric material is in contact with the cast product of the group of the first thermoelectric elements, and the first thermoelectric elements and second thermoelectric elements are alternatingly arrayed in a predetermined two-dimensional pattern and are jointed with each other (S37). According to the method of manufacturing the thermoelectric module according to the present exemplary embodiment, it is possible to eliminate the combining process explained in the above exemplary embodiment.

<Thermoelectric Module According to the Present Disclosure>

As a material of a thermoelectric module manufactured by a manufacturing method of the present disclosure, an alloy is usually used. As a material suitable for the thermoelectric material, a material of an iron-base Heusler alloy is used, for example. However, any material capable of being converted into molten metal may be applied to the manufacturing method of the present exemplary embodiment. Provided that a group of first thermoelectric elements is p-type thermoelectric elements made of a p-type thermoelectric material, in order to function as the thermoelectric module, it is necessary that a group of second thermoelectric elements is n-type thermoelectric elements made of an n-type thermoelectric material, and that the first thermoelectric element and second thermoelectric element are connected with each other in series. If the group of the first thermoelectric elements is the n-type thermoelectric elements made of the n-type thermoelectric material, it is necessary that the group of the second thermoelectric elements is the p-type thermoelectric elements made of the p-type thermoelectric material, and that the first thermoelectric element and second thermoelectric element are connected with each other in series. It is especially preferred that the first thermoelectric element is made of p-type semiconductor or n-type semiconductor, and that the second thermoelectric element is made of semiconductor whose type is different from that of the first thermoelectric element.

Figure 5:
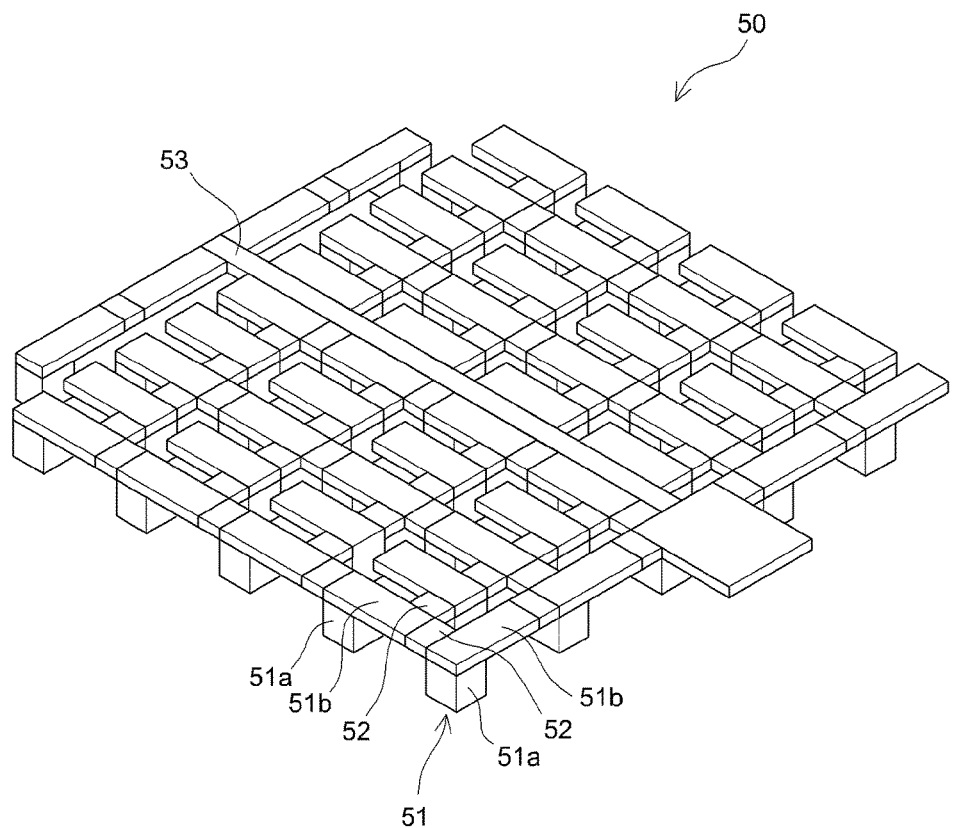
FIG. 5 is a perspective view of a first wax model 50 that represents a group of first thermoelectric elements according to another exemplary embodiment.
Figure 8:
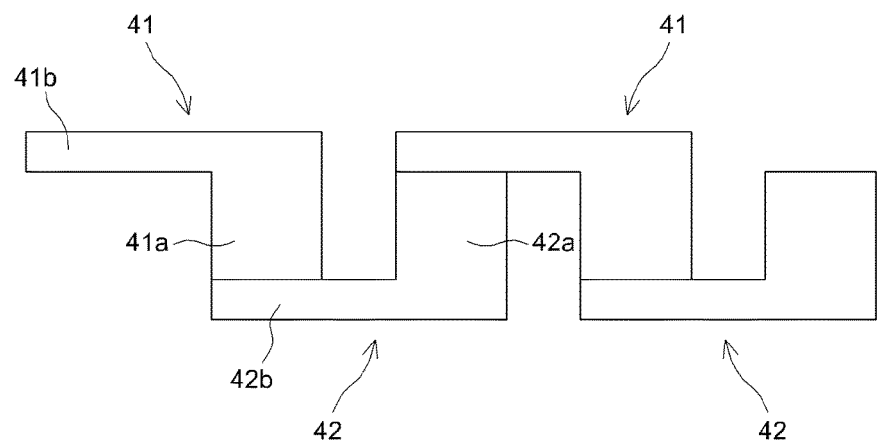
FIG. 8 is a plan view illustrating a state where first thermoelectric elements 41 are combined with second thermoelectric element 42 according to another exemplary embodiment.

The thermoelectric element used in the thermoelectric module of the present disclosure has a characteristic that it is manufactured by precision casting. Therefore, a degree of freedom in the shape is higher than ever, and various external shapes can be provided. As one exemplary embodiment, first thermoelectric elements 41 may be of a shape having a main body 41*a* and a connecting part 41*b* extending in an upper part of the main body, and second thermoelectric elements 42 may be of a shape having a main body 42*a* and a connecting part 42*b* extending in a lower part of the main body, as illustrated in FIG. 8. The connecting part 41*b* of the first thermoelectric element 41 may have a length necessary to be jointed with an entire upper surface of the main body of the second thermoelectric element 42. In the same manner, the connecting part 42*b* of the second thermoelectric element 42 may have a length necessary to be jointed with an entire lower surface of the main body of the first thermoelectric element 41. The thermoelectric elements 41, 42 of the present exemplary embodiment have a characteristic of having a wider jointing area of each other by making the connecting parts 41*b*, 42*b* longer, and thus to have a stable connecting strength. When a wax model is formed, in which a plurality of the thermoelectric elements having the long connecting part are arranged, it is possible to form a mold with a reduced runner(s) (in number and/or length). FIG. 5 shows a perspective view of a first wax model 50 that represents a state where a plurality of the first thermoelectric elements 41 are arranged in a predetermined pattern. The shape of the first thermoelectric element 41 is reproduced as a model part 51 of the first thermoelectric element, the main body 41a is reproduced as a main body model 51a, and the connecting part 41b is copied as a connecting part model 51b. Runner models 52, 52, . . . are disposed between adjacent connecting part models 51b, 51b, . . . . In the wax model 50 of the present exemplary embodiment, even though a runner model provided throughout the entire length is only a central runner model 53, a property of enough fluidity of molten metal can be obtained by allowing molten metal to flow through a part of a model corresponding to the connecting part. By manufacturing a group of the thermoelectric elements using the wax model 50 illustrated in FIG. 5, a reduced amount (number and/or length) of the runners can provide an effect of increase in the yield of the thermoelectric material in a casting.

Figure 6:
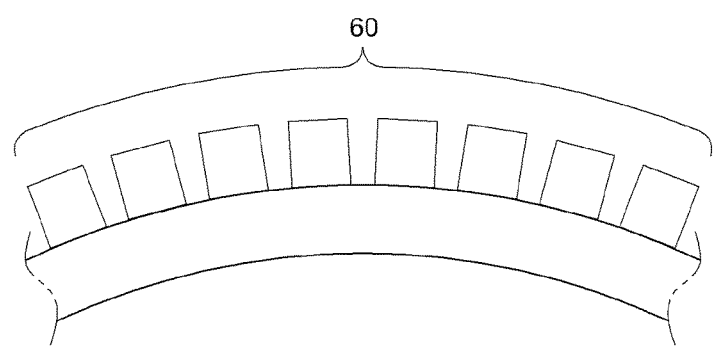
FIG. 6 is a plan view schematically illustrating a cast group 60 of the thermoelectric elements cast in a fashion that base surfaces are arranged along a cylinder.

Another mode of a thermoelectric module manufactured by the manufacturing method of the present disclosure will be explained below. A group of thermoelectric elements according to the present exemplary embodiment is cast using a model whose position and shape of its base are determined (or designed) beforehand, so that the bases of all thermoelectric elements are in contact with a predetermined curved surface when the group of the thermoelectric elements is arranged in a predetermined pattern. FIG. 6 shows a plan view schematically illustrating positions of a group of the cast thermoelectric elements 60 whose bases (base surfaces) lie along a cylinder (i.e., outer circumference of a cylinder). The thermoelectric elements 60 having the bases illustrated in FIG. 6 are manufactured by forming bases of the corresponding wax models so as to lie along the predetermined curved surface of the cylinder. The base of the wax model can truly reproduce the shape of the curved surface by applying an injection molding method or rapid prototyping method. Alternatively, the shape of the curved surface can be truly reproduced with a 3D printer.

<Other Examples of Modification>

The shapes and positions of the thermoelectric element explained in the present exemplary embodiments may be suitably modified. Although the thermoelectric element whose main body has a shape of a quadrangular prism is explained, the main body may have a shape of a round column or of a column having a polygonal cross-section. A gap (or interval) between adjacent thermoelectric elements and a shape of the connecting part may be suitably modified according to a processing property and electrical/thermal property of a material made of the thermoelectric element.

The entire disclosures of the above Patent Literatures are incorporated herein by reference thereto. Modifications and adjustments of the exemplary embodiment may be made within the scope of the entire disclosure (including the claims) of the present invention and based on the basic technical concept of the present invention. Various combinations and selections of various disclosed elements (including each element of each claim, each element of each exemplary embodiment, each element of each drawing, etc.) may be made within the scope of the claims of the present invention. That is, the present invention of course includes various variations and modifications that could be made by those skilled in the art according to the entire disclosure including the claims and the technical concept. Particularly, any numerical range disclosed herein should be interpreted that any intermediate values or subranges falling within the disclosed range are also concretely disclosed even without specific recital thereof. Particularly the singular form may represent also a plural form, which is based on the nature of the disclosure and especially based on the Japanese language of the priority application.

A thermoelectric module manufactured by a manufacturing method of the present invention may be installed at a part of an exhaust system of a car, a pipe for warm water and an exhaust pipe of high temperature in a factory and the like by making required wiring and being covered with an insulating material such as alumina, and thus generate electricity by means of difference in temperature. Particularly, a thermoelectric module whose base has a shape lying along a cylinder is easy to be applied on an outer surface of a pipe or exhaust pipe as a heat source.

REFERENCE SIGNS LIST 1, 41 First thermoelectric element
2 Main body of first thermoelectric element
3a, 3b, 41b Connecting part of first thermoelectric element
4, 42 Second thermoelectric element
5 Main body of second thermoelectric element
6a, 6b, 42b Connecting part of second thermoelectric element
9 Attachment
10, 31, 50 First wax model
11, 51 Model of first thermoelectric element
12, 51a Main body model of first thermoelectric element
3a, 3b, 51a Connecting part model of first thermoelectric element
14, 15, 16, 52, 53 Runner model
20 Second wax model
30 Wax model
35 Wax model assembly

The invention claimed is:

1. A method of manufacturing a thermoelectric module, comprising:
forming a first wax model, wherein the first wax model which represents a state where first thermoelectric elements being a p-type thermoelectric element or n-type thermoelectric element are arranged in a first predetermined pattern, wherein the first wax model includes at least one first gate/runner;
forming a first mold by setting a mold material in which the first wax model, including the at least one first gate/runner, has been imbedded, and melting out the first wax model;
casting a first group of the first thermoelectric elements that are arranged in the first predetermined pattern, by pouring molten metal of a first thermoelectric material into the first mold through at least the first gate/runner to solidify the molten metal, so that the first thermoelectric elements in the first group are connected via the at least one first gate/runner;
forming a second wax model, wherein the second wax model which represents a state where second thermoelectric elements being a n-type thermoelectric element or p-type thermoelectric element are arranged in a second predetermined pattern, wherein the second wax model includes at least one second gate/runner;
forming a second mold by setting a mold material in which the second wax model, including the at least one second gate/runner, has been imbedded, and melting out the second wax model;

casting a second group of the first thermoelectric elements that are arranged in the second predetermined pattern, by pouring molten metal of a second thermoelectric material into the second mold through at least the second gate/runner to solidify the molten metal, so that the second thermoelectric elements in the second group are connected via the at least one second gate/runner;

contacting the first group of the first thermoelectric elements and the second group of the second thermoelectric elements, then jointing the first group of the first thermoelectric elements with the second group of the second thermoelectric elements so that the first group of the first thermoelectric elements and the second group of the second thermoelectric elements are connected physically and electrically in series; and then removing the first and second gates/runners.

2. The method according to claim 1, wherein
a first wax model assembly is formed, in which a plurality of the first wax models are connected in a tree shape via the first gate/runner;
a second wax model assembly is formed, in which a plurality of the second wax models are connected in a tree shape via the second gate/runner;
a plurality of the first groups of the first thermoelectric elements are simultaneously cast in one casting step, using a first mold that is formed from the first wax model assembly; and
a plurality of the second groups of the second thermoelectric elements are simultaneously cast in one casting, using a second mold that is formed from the second wax model assembly.

3. The method according to claim 1, wherein
the first and second wax models are formed so that their bases lie along a predetermined curved surface,
so that the resulting first and second thermoelectric elements lie along the predetermined curved surface.

4. The method according to claim 1, wherein
the second mold is combined with the first group of the first thermoelectric elements in said forming the second mold; and
said thermoelectric module, in which the first group of the first thermoelectric elements and the second group of the second thermoelectric elements are jointed with each other, is cast by pouring molten metal of the second thermoelectric material into the second mold to solidify the molten metal.

5. The method according to claim 2, wherein
the first and second wax models are formed so that their bases lie along a predetermined curved surface,
so that the resulting first and second thermoelectric elements lie along the predetermined curved surface.

6. The method according to claim 2, wherein
the second mold is combined with the first group of the first thermoelectric elements in said forming the second mold; and
said thermoelectric module, in which the first group of the first thermoelectric elements and the second group of the second thermoelectric elements are jointed with each other, is cast by pouring molten metal of the second thermoelectric material into the second mold to solidify the molten metal.

7. The method according to claim 3, wherein
the second mold is combined with the first group of the first thermoelectric elements in said forming the second mold; and
said thermoelectric module, in which the first group of the first thermoelectric elements and the second group of the second thermoelectric elements are jointed with each other, is cast by pouring molten metal of the second thermoelectric material into the second mold to solidify the molten metal.

* * * * *